(12) United States Patent
Zhang et al.

(10) Patent No.: US 6,376,335 B1
(45) Date of Patent: Apr. 23, 2002

(54) SEMICONDUCTOR WAFER MANUFACTURING PROCESS

(75) Inventors: David Zhang, Ballwin; Kanyin Ng, Maryland Heights; Henry F. Erk, St. Louis, all of MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/506,105

(22) Filed: Feb. 17, 2000

(51) Int. Cl.[7] .............................................. H01L 21/322
(52) U.S. Cl. ...................... 438/471; 438/691; 438/692; 451/41
(58) Field of Search ................................ 438/476, 471, 438/690, 691, 692, 693; 148/33.4, 33.3; 216/99; 451/57, 37

(56) References Cited

U.S. PATENT DOCUMENTS

| | | | |
|---|---|---|---|
| 4,053,335 A | 10/1977 | Hu ............................... | 148/174 |
| 5,389,551 A | 2/1995 | Kamakura et al. | |
| 5,389,579 A | 2/1995 | Wells .......................... | 437/225 |
| 5,424,224 A | 6/1995 | Allen et al. ..................... | 437/10 |
| 5,643,405 A | 7/1997 | Bello et al. .............. | 156/636.1 |
| 5,914,275 A | 6/1999 | Kodera et al. .............. | 438/693 |
| 5,998,283 A | * 12/1999 | Takamizawa et al. ....... | 438/476 |
| 6,051,498 A | * 4/2000 | Pietsch et al. .............. | 438/691 |
| 6,227,944 B1 | * 5/2001 | Xin et al. ..................... | 451/41 |

FOREIGN PATENT DOCUMENTS

| | | |
|---|---|---|
| EP | 0857542 A1 | 8/1998 |
| JP | 05315305 | 11/1993 |
| JP | 10041310 | 2/1998 |
| JP | 10223580 A | 8/1998 |
| WO | WO 99/31723 | 6/1999 |

OTHER PUBLICATIONS

May 7, 2001 International Search Report from European Patent Office.

* cited by examiner

Primary Examiner—Charles Bowers
Assistant Examiner—Timothy Sutton
(74) Attorney, Agent, or Firm—Senniger, Powers, Leavitt & Roedel

(57) ABSTRACT

A semiconductor wafer manufacturing process is disclosed wherein extremely flat, double side polished semiconductor wafers having enhanced gettering characteristics on the back surface are produced. The process includes creating an enhanced gettering layer on the back surface of a double side polished semiconductor wafer. A protective layer is subsequently grown on the enhanced gettering layer and the wafer is subsequently subjected to a second double side polishing operation. Finally, the protective layer is removed and the front surface final polished to produce an extremely flat semiconductor wafer having enhanced gettering characteristics on the back surface.

23 Claims, 2 Drawing Sheets

SEMICONDUCTOR WAFER MANUFACTURING PROCESS

BACKGROUND OF THE INVENTION

The present invention relates to a process for manufacturing semiconductor wafers. More particularly, the present invention relates to a semiconductor manufacturing process which produces extremely flat, double side polished semiconductor wafers having an enhanced gettering layer on the back surface of the semiconductor wafer.

The semiconductor industry continues to design integrated circuit devices which utilize increasingly smaller and more complex geometries. As a result, the semiconductor substrates, such as silicon wafers, used to build devices are subject to increasingly tighter constraints and must have extremely low defect concentrations and be extremely flat to ensure proper device performance. Substrate global flatness is generally characterized by total thickness variation (TTV), which is the difference between the minimum and maximum values of thickness encountered in the wafer. The site flatness on the substrate is generally characterized by Site Total Indicated Reading (STIR), which is the distance between the highest and lowest points on a site from a specified reference plane.

Conventional techniques such as the so-called Czochralski process are well known in the art for growing single crystal ingots used to produce semiconductor wafers. Once an ingot of a semiconductor material, such as silicon, is grown and shaped, it is generally sliced into individual wafers and refined by etching and/or lapping and grinding to increase flatness. Generally, the substrate edges are rounded and the wafer etched to remove any damage and contamination. Finally, the wafers are polished on one or both sides and cleaned to provide a semiconductor wafer suitable for device fabrication. At various points in the manufacturing process the wafer can be treated such that its gettering capabilities are increased.

When polishing the surfaces of a semiconductor substrate, manufacturers generally use either single sided or double sided polishing equipment. With the increasing flatness requirements for substrates necessitated by more complex geometries, double side polishing is becoming much more important and is being increasingly utilized by semiconductor substrate manufactures as it provides increased substrate flatness as compared to single side polishing.

One limitation of the use of double side polishing, however, is that conventional techniques have not allowed the production of extremely flat, double side polished wafers which have enhanced gettering characteristics on the back surface of the wafer. Enhanced gettering layers have conventionally been created on the back surface of the wafer by damage techniques such as sandblasting, for example, or by growing a thin polysilicon film on the back surface. Wafers having enhanced gettering characteristics may be desirable to some device manufacturers as this type of external gettering can trap and hold many types of impurities and keep them from migrating toward the front surface region of the semiconductor wafer where devices are ultimately printed. Extremely thick polysilicon gettering layers on the back surface are very expensive and time consuming to grow and can cause contamination problems of the front surface. Thinner enhanced gettering layers are much more easily removed by polishing pads as compared to single crystal materials, and hence, conventional double side polishing almost completely removes and destroys thinner enhanced gettering layers during the double side polishing process. As such, a need exists in the semiconductor industry for a semiconductor manufacturing process incorporating double side polishing which produces extremely flat semiconductor substrates yet allows an enhanced gettering layer to remain intact on the back surface of the semiconductor wafer for use during high temperature processing steps.

SUMMARY OF THE INVENTION

Among the objects of the present are the provision of a manufacturing process which produces ultra-flat semiconductor wafers ; the provision of a manufacturing process which produces semiconductor wafers having an enhanced gettering layer on the back surface; the provision of a manufacturing process which utilizes double side polishing in combination with a protective layer such as a low temperature oxide to produce an ultra-flat semiconductor wafer with enhanced back surface gettering; and the provision of a manufacturing process which produces low cost grade 1 semiconductor wafers with enhanced external gettering on the back surface.

Briefly, therefore, the present invention is directed to a process for manufacturing a semiconductor wafer sliced from a single crystal ingot. The process comprises a first double side polishing operation to increase wafer flatness and reduce damage on the wafer surfaces followed by forming a gettering layer on the back surface of the wafer. A protective layer is then formed on top of the gettering layer to protect the gettering layer during subsequent manufacturing and a second double side polishing operation is performed on the wafer to increase flatness. Finally, the protective layer is removed from the back surface of the semiconductor wafer.

The present invention is further directed to a process for manufacturing a semiconductor wafer sliced from a single crystal ingot. The process comprises first slicing a semiconductor wafer from a single-crystal ingot followed by lapping and/or grinding the wafer and etching the wafer in a chemical etchant. Next, a first double side polishing operation is performed on the wafer before a polycrystalline silicon layer is grown on the back surface to allow the back surface to getter impurities. Next, a silicon oxide layer is grown on top of the polycrystalline layer to protect the polycrystalline layer during further processing. Finally, a second double side polishing operation is performed on the wafer and the protective layer is removed prior to a final polishing operation.

The present invention is further directed to a semiconductor wafer having a front surface and a back surface wherein the back surface has an enhanced gettering layer. The wafer has a TTV of between about 0.1 micrometers and about 1 micrometer, an STIR between about 0.1 micrometers and about 0.2 micrometers and an average front surface roughness of about 5 nanometers over an area of about 1 millimeter by about 1 millimeter.

Other objects and features of this invention will be in part apparent and in part pointed out hereinafter.

DETAILED DESCRIPTION OF THE PREFERRED EMBODIMENTS

In accordance with the present invention, it has been discovered that semiconductor wafers having a high degree of global flatness and enhanced gettering characteristics may be fabricated using a process comprising a first double side polishing operation followed by the creation of a gettering layer on the back surface which is protected by a protective layer during a second double side polishing process. The protective layer is subsequently stripped off the back surface of the semiconductor wafer after the second double side polishing operation and prior to a final polishing of the front surface of the semiconductor wafer to impart a glossy finish on that surface. Surprisingly, the use of a protective layer such as a low temperature oxide on top of the gettering layer protects the gettering layer during double side polishing and allows ultra-flat wafers to be produced with external gettering.

Figure 1:
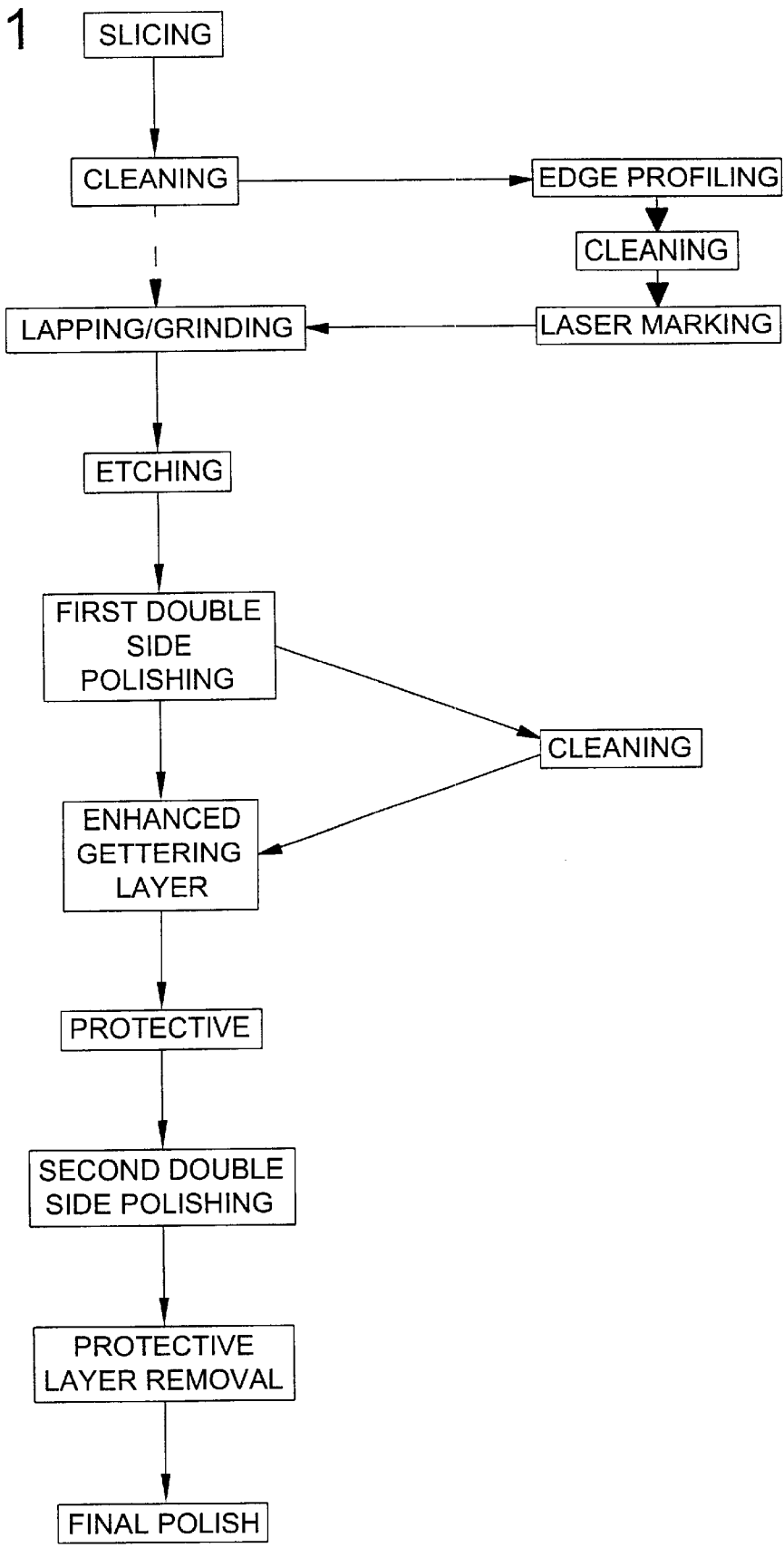
FIG. 1 is a flow diagram showing the manufacturing process of the present invention.

Referring now to FIG. 1, there is shown a flow chart detailing the process steps of the present invention to produce flat semiconductor wafers having an enhanced gettering layer on the back surface. As indicated in FIG. 1, the semiconductor wafer is sliced from a single-crystal ingot utilizing a conventional internal diameter saw or wire saw to produce a thin wafer disk having a predetermined initial thickness. The wafer has a front surface and a back surface, and an imaginary central plane between the front and back surfaces. The terms "front" and "back" in this context are used to distinguish the two major, generally planar surfaces of the wafer. The front surface for purposes of this invention is the surface upon which electronic devices are ultimately printed while the back surface is the surface having the enhanced gettering layer subsequently discussed. The initial thickness of each wafer is substantially greater than the desired end thickness of the finished wafer to allow subsequent processing operations to reduce the thickness of the wafer without the risk of damaging or fracturing the wafer. For example, the initial thickness of the semiconductor wafer may be between about 800 and about 1200 micrometers.

After slicing, the semiconductor wafer is generally subjected to a conventional cleaning operation to remove particulate matter deposited on the wafer during the slicing operation. This cleaning process may include sequential tanks of etching solution, cleaning solution and water rinses. Approximately 2 to 10 micrometers of material is removed from both the front and the back surfaces of the semiconductor wafer during cleaning. At this stage of the manufacturing process, the peripheral edge of the wafer may also be profiled by a conventional edge grinder to reduce the risk of damage to the wafer during further processing. The wafer is generally cleaned after profiling in a similar manner as described above. The wafer may then be optionally marked by laser for identification prior to the next operation.

Referring again to FIG. 1, the wafer is next subjected to a conventional lapping and/or grinding operation to lessen the waviness and surface damage on the wafer generated from ingot slicing. The lapping and/or grinding operation generally removes between about 40 micrometers and about 80 micrometers, preferably about 60 micrometers of material from the wafer. After the conventional lapping and/or grinding operation the wafer generally has a TTV of between about 0.5 micrometers and about 1.5 micrometers and a surface roughness ($R_A$) of between about 0.1 micrometers and about 0.5 micrometers over an area of about 1 millimeter by about 1 millimeter. It will be recognized by one skilled in the art that conventional lapping and/or grinding techniques are well known in the industry and various methods can be utilized to carry out the operation.

Again referring the FIG. 1, the wafer is next subjected to an etching operation in which the wafer is immersed in a chemical etchant to further reduce the thickness of the wafer and to further remove damage remaining on the semiconductor wafer surfaces. Conventional etching techniques such as acidic or alkaline immersion etching wherein the semiconductor wafer is completely immersed in an etchant solution for a short period of time generally on the order of about 1 minute to about 7 minutes are in accordance with the present invention. After the etching operation is complete, the semiconductor wafer generally has a TTV of between about 1 micrometer and about 4 micrometers, more preferably about 2.5 micrometers and an average front surface roughness ($R_A$) of between about 50 nanometers and about 100 nanometers over an area of about 1 millimeter by about 1 millimeter, preferably about 75 nanometers over an area of about 1 millimeter by about 1 millimeter. The conventional immersion etching techniques generally remove about 40 micrometers of material total from the semiconductor wafer, or about 20 micrometers from the front and about 20 micrometers from the back surface. It would be recognized by one skilled in the art that other etching techniques, such plasma etching or micro-etching may also be used in accordance with the present invention.

After the etching operation, the wafer is next subjected to a first double side polishing operation for concurrent polishing of the front and back surfaces of the wafer to increase wafer flatness and remove damage that may have been created during prior processing steps. Also, the highly reflective and substantially damage free surface created by the double side polishing operation on the back surface helps ensure that an enhanced gettering layer can be created on the back surface of the semiconductor wafer as described below. One type of conventional double side polishing machine is manufactured by Peter Wolters under the model designation Double Side Polisher AC2000. Construction and operation of a conventional double side polishing machine for polishing semiconductor wafers is well known to those skilled in the art and will only be summarily described herein.

The machine includes a rotating lower plate having a polishing surface defined by a polishing pad, and a carrier seated on the polishing pad that is rotatable relative to the rotating lower plate and polishing pad. Wafers are held in the carrier with a front surface of each wafer engaging the polishing pad. A second polishing pad facing opposite the front surface of the wafer is mounted on an upper plate. This upper plate is attached to a motor driven spindle that rotates the upper plate and polishing pad relative to the wafer carrier and the lower plate. The spindle is capable of being moved up and down along a vertical axis for moving the second polishing pad into polishing engagement with the back surface of the wafer to sandwich the wafer between the two polishing pads. The pressure exerted on the wafer by the pads is preferably between about 1 psi and about 3 psi, most preferably about 3 psi. This first double side polishing operation removes between about 10 micrometers and about 40 micrometers, preferably about 30 micrometers of material total from the semiconductor wafer, or between about 5 micrometers and about 20 micrometers, preferably about 15 micrometers of material from both the front and back surfaces of the wafer. After the double side polishing is complete, the total thickness variation of the semiconductor wafer is between about 0.1 micrometers and about 1 micrometer, preferably between about 0.1 micrometers and about 0.5 micrometers, the STIR (using the front surface as the reference plane) is between about 0.1 microns and about 0.2 microns, preferably between about 0.1 microns and about 0.15 microns, and the average front surface roughness, $R_A$, is about 5 Angstroms over an area of about 1 millimeter by about 1 millimeter.

During the double side polishing operation a slurry containing abrasive particles is applied between the polishing pads and the wafer to help polish the surface of the wafer. Preferably, the resulting pH of the polishing slurry is between about 10 and about 12, with a higher pH resulting in a faster rate of material removal. Preferably, the particle sizes range from between about 1 to about 10 micrometers, more preferably between about 2 to about 6 micrometers, and most preferably between about 3 and about 5 micrometers. It would be recognized by one skilled in the art that conventional slurries such as SYTON HT-50 manufactured by DuPont of Wilmington Del. are suitable for use in the present invention.

The polishing pads work the slurry against the surfaces of the wafer to concurrently and uniformly remove material from the front and back surfaces of the wafer and help improve the overall flatness of the wafer. As both surfaces of the wafer are polished, silicon is removed and some damage is created on the surface by the abrasive action of the slurry. The damage created by the polishing slurry on the front surface is subsequently removed in the following operations discussed below.

After the double side polishing operation, the wafer may optionally be subjected to a cleaning operation prior to further processing. This cleaning operation removes contaminants such as organics, metals, and various other particles from the wafer surfaces that may have been deposited from prior processing steps. Standard cleaning processes such as the well-known "RCA" type cleaning are acceptable. Typically, in an RCA cleaning procedure the wafer is immersed in a solution of $H_2O$—$NH_4OH$—$H_2O$. The solution is maintained at a temperature of about 65 to about 85° C. After approximately 5 to 15 minutes in the solution, the wafer is removed and rinsed in water. After rinsing, the wafer is immersed for about 15 seconds in a 10:1 HF solution to remove any oxide formed during the first step. Next, the wafer is immersed in a solution of $H_2O$—HCl—$H_2O_2$ heated to about 65 to about 80° C. After about 5 to about 15 minutes in the HCl solution, the wafer is rinsed and dried. One skilled in the art would realize that other conventional cleaning processes would also be acceptable to remove unwanted contaminants.

After the first double side polishing operation, the back surface of the semiconductor wafer is subjected to an operation to create an enhanced gettering layer on the back surface so that this surface can act as an effective gettering sink to attract impurities away from the front surface region of the wafer where devices are ultimately printed. An enhanced gettering layer can be created on the back surface of the wafer in several ways in accordance with the present invention, including the use of conventional techniques that form mechanical damage on the back surface of the wafer to attract impurities. Conventional techniques that create damage on the back surface of the wafer include, for example, sandblasting, etching, and grinding. Preferably, the enhanced gettering layer on the back surface of the wafer is created by growing a small-grain size polycrystalline silicon layer on the back surface of the wafer. As used herein, enhanced gettering layer is used to mean either a layer of polycrystalline silicon or mechanical damage formed on the back surface of the wafer.

Polycrystalline silicon is inherently compatible with the silicon substrates, and because it induces negligible stress in the substrate it can remain indefinitely on the substrate without being detrimental to performance. The polycrystalline silicon layer may cover the entire back surface of the semiconductor substrate, or may cover distinct portions of the back surface and may either be undoped or doped with oxygen or another suitable dopant. The small grain size of the polycrystalline silicon makes for an ideal gettering sink for impurities such as copper, iron, nickel, sodium and potassium, for example, on the back surface of the semiconductor wafer. During processing, increased temperatures of the wafer allow contaminants to migrate within the substrate and move toward the gettering sink, and hence away from the front surface region where devices are ultimately printed. In accordance with the present invention, the polycrystalline silicon layer on the back surface has a thickness of between about 0.5 micrometers and about 5, preferably between about 0.5 and about 3 micrometers, and most preferably about 2 micrometers. In a preferred embodiment of the present invention the polycrystalline silicon layer covers the entire back surface. The growth of polycrystalline silicon layers on semiconductor substrates for gettering purposes in well known in the art, and is fully described in U.S. Pat. No. 4,053,335, incorporated herein by reference.

Again referring to FIG. 1, the semiconductor wafer is next subjected to an operation to grow a protective layer on the back surface of the wafer on top of the enhanced gettering layer. The protective layer may be a dielectric layer such as silicon nitride or silicon oxide, for example. A dielectric layer such as silicon oxide is preferred because it may be formed on the back surface at low temperatures (generally about 450° C. to about 650° C.) which substantially reduces defect formation and migration within semiconductor wafers during the oxide growth. It will be recognized by one skilled in the art that the oxide layer would be grown on top of damage created on the back surface of the semiconductor wafer if conventional damage-creation methods were utilized to create the enhanced gettering layer on the back surface of the wafer.

In a preferred embodiment, the enhanced gettering layer covers the entire back surface and the protective layer is deposited over the entire back surface such that it covers the entire enhanced gettering layer. If the enhanced gettering layer covers only selected portions of the back surface of the semiconductor wafer, it is preferred that the protective layer be deposited such that it completely covers the back surface such that during the subsequent second double side polishing operation the wafer remains substantially flat. The protective layer is preferably deposited at low temperatures and pressures. Such layers are conventionally prepared in dielectric furnaces. The protective layer is grown on the back surface of the semiconductor wafer to a thickness of at least about 100 nanometers, preferably at least about 200 nanometers, more preferably at least about 300 nanometers, more preferably about at least about 400 nanometers, and still more preferably at least about 500 nanometers. The protective layer protects the enhanced gettering layer from being completely removed or substantially reduced resulting in damage to the enhanced gettering layer during a subsequent double side polishing operation. The removal rate of the protective layer, such as a low temperature oxide layer, is approximately 15 to 20 times lower than that of silicon material during a double side polishing process, and thus the enhanced gettering layer is protected and is held substantially in tact. Thus, by growing a protective layer such as a low temperature oxide layer on top of the enhanced gettering layer, the enhanced gettering layer is protected during the subsequent double side polishing operation.

Again referring to FIG. 1, after the protective layer is grown on the back surface of the semiconductor wafer, the wafer is subjected to a second double side polishing operation. The double side polishing operation itself is described above. This second double side polishing operation substantially removes all defects from the front surface of the semiconductor wafer that are caused by growth of the enhanced gettering layer and the protective layer. Such defects may include, for example, polysilicon residue caused by splashing or scratches on the surface. As such, the second double side polishing operation helps produce flat semiconductor wafers with a substantially defect-free front surface. The second double side polishing operation removes between about 1 micrometer and about 10 micrometers, preferably between about 2 micrometers and about 8 micrometers of material total from the semiconductor wafer. Because of the difference in material removal rates between silicon and the protective layer described above, substantially all of the material is removed from the front surface of the wafer in the second double side polishing operation. After the second double side polishing operation is complete, the total thickness variation of the semiconductor wafer is between about 0.1 micrometers and about 1 micrometer, preferably between about 0.1 micrometers and about 0.5 micrometers, the STIR (using the front surface as the reference plane) is between about 0.1 microns and about 0.2 microns, preferably between about 0.1 microns and about 0.15 microns, and the average front surface roughness, $R_A$, is about 5 Angstroms over an area of about 1 millimeter by about 1 millimeter.

Again referring to FIG. 1, the semiconductor wafer is next subjected to an operation to strip the protective layer from the back surface of the semiconductor wafer. One skilled in the art will recognize that there are many conventional methods that can be used to remove the protective layer from the back surface of the semiconductor wafer including, for example, acidic and basic washes. One conventional technique which can be used in accordance with the present invention is a hydrofluoric acid stripping technique. With this method, the semiconductor wafer can be completely immersed into a bath of about 49% hydrofluoric acid in water for a period of about a few seconds to a few minutes to remove the protective layer from the back surface of the semiconductor wafer. Alternatively, the semiconductor wafer can be subjected to vaporous hydrofluoric acid for a period of a few seconds to a few minutes to remove the protective layer from the back surface of the semiconductor wafer. The vapor is comprised of 49% hydrofluoric acid in water. These conventional techniques dissolve the protective layer from the back surface of the semiconductor wafer while leaving the enhanced gettering layer substantially in tact on the back surface. As such, an extremely flat wafer having enhanced gettering characteristics on the back surface is produced.

Figure 2:
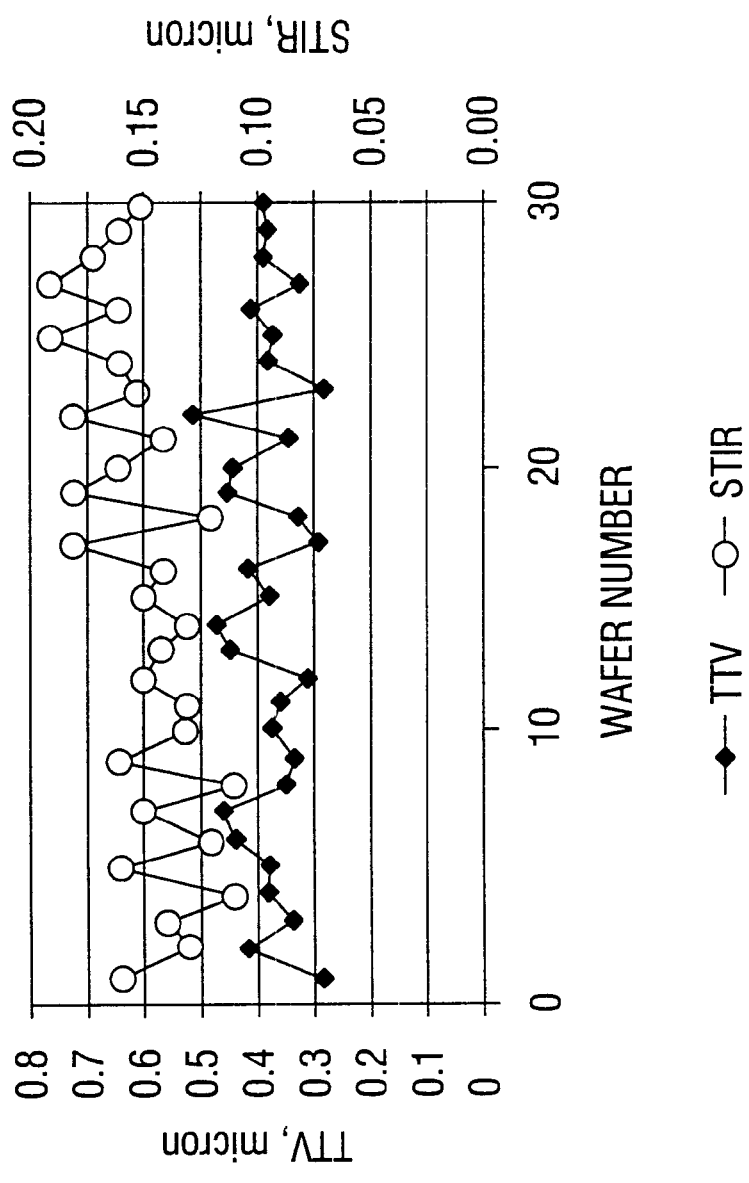
FIG. 2 is a graph showing Total Thickness Variation measurements and Site Total Indicated Reading measurements of 30 different 200 millimeter semiconductor wafers prepared in accordance with the present invention.

Finally, the front surface of the semiconductor wafer is subjected to a final "touch" or "flash" polishing operation to improve sub-micron roughness and substantially eliminate minor defects remaining on the front surface of the semiconductor wafer after the second double side polishing operation. The final polishing also maintains the wafer flatness while imparting a smooth, specular finish to the front surface of the semiconductor wafer typical for polished wafers and desired by many device manufactures. This type of final polish is known to those skilled in the art and generally removes less than about 1 micrometer of material, preferably between about 0.25 micrometers and about 0.5 micrometers of material from the front surface of the semiconductor wafer in a chemical/mechanical polishing process using, for example, a dilute ammonia stabilized colloidal silica slurry and conventional polishing equipment. A preferred ammonia stabilized colloidal silica slurry is Glanzox 3900, which is commercially available from Fujimi Incorporated of Aichi Pref. 452, Japan. Glanzox 3900 has a silica content of from about 8 to about 10% and a particle size of from about 0.025 to about 0.035 micrometers. If the ammonia stabilized silica slurry is not diluted prior to use, the polished wafer will not be as smooth as a wafer treated with a diluted slurry. A dilution of about one part silica slurry to about 10 parts deionized water is preferred. After final polishing the semiconductor wafer has a TTV of between about 0.1 micrometers and about 1 micrometer, preferably between about 0.1 micrometers and about 0.5 micrometers, the STIR (using the front surface as the reference plane) is between about 0.1 microns and about 0.2 microns, preferably between about 0.1 microns and about 0.15 microns, and the average front surface roughness, $R_A$, is about 5 Angstroms over an area of about 1 millimeter by about 1 millimeter. FIG. 2 shows a graph of 30 different 200 millimeter semiconductor wafers which were manufactured in accordance with the present invention. The graph shows the TTV and STIR of the wafers after final polishing. As FIG. 2 indicates, the resulting TTV of the wafers is between about 0.3 and about 0.5 micrometers and the resulting STIR is between about 0.1 and about 0.2 micrometers.

In view of the above, it will be seen that the several objects of the invention are achieved. As various changes could be made in the above-described semiconductor wafer manufacturing process without departing from the scope of the invention, it is intended that all matter contained in the above description be interpreted as illustrative and not in a limiting sense.

What is claimed is:

1. A process for manufacturing a semiconductor wafer sliced from a single crystal ingot, the wafer having a front surface and a back surface, the process comprising:

a first double side polishing operation to increase wafer flatness and reduce damage on the wafer surfaces;

forming a gettering layer on the back surface of the semiconductor wafer;

forming a protective layer on the gettering layer to protect the gettering layer during further semiconductor wafer processing;

a second double side polishing operation to produce a substantially flat wafer and reduce defects from the front surface of the semiconductor wafer; and removing the protective layer from the back surface of the semiconductor wafer.

2. The process as set forth in claim 1 wherein the front surface of the semiconductor wafer is subjected to a final polishing after the protective layer is removed from the back surface wherein less than about 1 micrometer of material is removed from the front surface.

3. The process as set forth in claim 1 wherein the semiconductor wafer is subjected to an etching operation before the first double side polishing operation such that after the etching operation the semiconductor wafer has a total thickness variation of between about 1 micrometer and about 4 micrometers and an average front surface roughness of between about 50 nanometers and about 100 nanometers over an area of about 1 millimeter by about 1 millimeter.

4. The process as set forth in claim 3 wherein the semiconductor wafer is subjected to at least one of a lapping operation and a grinding operation before the etching operation such that after the lapping operation the wafer has a total thickness variation of between about 0.5 and about 1.5 micrometers.

5. The process as set forth in claim 1 wherein after the first double side polishing operation the semiconductor wafer has a total thickness variation between about 0.1 micrometer and about 1 micrometer and an average surface roughness of about 5 Angstroms over an area of about 1 millimeter by about 1 millimeter.

6. The process as set forth in claim 5 wherein the total material removed from both the front and the back surfaces of the semiconductor wafer is between about 10 micrometers and about 40 micrometers.

7. The process as set forth in claim 6 wherein the total material removed from both the front and the back surfaces of the semiconductor wafer is about 30 micrometers.

8. The process as set forth in claim 1 wherein the gettering layer on the back surface of the semiconductor wafer is a polycrystalline silicon layer on the back surface.

9. The process as set forth in claim 8 wherein the polycrystalline silicon layer has a thickness of between about 0.5 micrometers and about 3 micrometers.

10. The process as set forth in claim 9 wherein the polycrystalline silicon layer has a thickness of about 2 micrometers.

11. The process as set forth in claim 1 wherein the gettering layer on the back surface of the semiconductor wafer is created by damaging the back surface of the wafer utilizing one of the methods selected from the group consisting of sandblasting, etching, and grinding.

12. The process as set forth in claim 1 wherein the protective layer is silicon oxide and has a thickness of at least about 100 nanometers.

13. The process as set forth in claim 12 wherein the protective layer is silicon oxide and has a thickness of at least about 200 nanometers.

14. The process as set forth in claim 12 wherein the protective layer is silicon oxide and has a thickness of at least about 300 nanometers.

15. The process as set forth in claim 12 wherein the protective layer is silicon oxide and has a thickness of at least about 400 nanometers.

16. The process as set forth in claim 12 wherein the protective layer is silicon oxide and has a thickness of at least about 500 nanometers.

17. The process as set forth in claim 1 wherein the protective layer is selected from the group consisting of silicon oxide and silicon nitride.

18. The process as set forth in claim 1 wherein the second double side polishing operation removes a total of between about 1 micrometer and about 10 micrometers of material total from the front and back surfaces of the semiconductor wafer such that the resulting total thickness variation of the semiconductor wafer is between about 0.1 micrometers and about 1 micrometer.

19. The process as set forth in claim 1 wherein the semiconductor wafer has a total thickness variation of between about 0.1 micrometers and about 0.5 micrometers and an average surface roughness of about 5 Angstroms over an area of about 1 millimeter by about 1 millimeter after the second double side polishing operation.

20. The process as set forth in claim 1 wherein the semiconductor wafer has an STIR of between about 0.1 micrometers and about 0.2 micrometers after the second double side polishing operation.

21. The process as set forth in claim 1 wherein the semiconductor wafer has an STIR of about 0.15 micrometers after the second double side polishing operation.

22. The process as set forth in claim 1 wherein hydrofluoric acid is used to remove the protective layer from the back surface of the semiconductor wafer.

23. A process for manufacturing a semiconductor wafer sliced from a single crystal ingot, the wafer having a front surface and a back surface, the process comprising:

slicing a semiconductor wafer from a single-crystal ingot;

performing at least one of lapping the wafer and grinding the wafer to reduce waviness and surface damage;

etching the semiconductor wafer in a chemical enchant to reduce the thickness of the semiconductor wafer and reduce damage on the front and back surfaces;

a first double side polishing operation to increase wafer flatness and remove damage on the wafer surfaces;

growing a polycrystalline silicon layer on the back surface of the semiconductor wafer such that the back surface can getter impurities away from the front surface;

growing a silicon oxide layer on top of the polycrystalline silicon layer to protect the polycrystalline silicon layer during further semiconductor wafer processing;

a second double side polishing operation to produce a substantially flat wafer and reduce defects from the front surface of the semiconductor wafer;

removing the protective layer from the back surface of the semiconductor wafer utilizing hydrofluoric acid; and final polishing the front surface of the semiconductor wafer to improve sub-micron roughness on the front surface.

* * * * *